United States Patent [19]
Benco et al.

[11] Patent Number: 5,832,413
[45] Date of Patent: Nov. 3, 1998

[54] GENERATOR PROTECTION SYSTEM AND METHOD FOR PHASOR ESTIMATION AND FREQUENCY TRACKING DURING FREQUENCY RAMPING

[75] Inventors: Joseph P. Benco, Germansville; Frederick P. Perfect, Mohnton, both of Pa.; David G. Hart; James D. Stoupis, both of Raleigh, N.C.

[73] Assignee: ABB Power T&D Company Inc., Raleigh, N.C.

[21] Appl. No.: 939,514

[22] Filed: Sep. 29, 1997

Related U.S. Application Data

[63] Continuation-in-part of Ser. No. 574,357, Dec. 18, 1995, Pat. No. 5,721,689.

[51] Int. Cl.$^6$ ............................. G01R 23/10; G01R 23/16
[52] U.S. Cl. ................................ 702/77; 702/75; 702/76; 702/66; 702/112; 341/123; 324/76.28; 324/76.55; 324/76.47; 324/76.68
[58] Field of Search ................................. 702/75–77, 66, 702/64, 112; 324/76.28, 76.21, 76.35, 76.44, 76.47, 76.11, 76.55, 76.68; 341/123; 356/350; 364/528.21

[56] References Cited

U.S. PATENT DOCUMENTS

| | | | |
|---|---|---|---|
| 4,276,650 | 6/1981 | Jager et al. | 375/359 |
| 4,319,329 | 3/1982 | Girgis et al. | 702/75 |
| 4,786,168 | 11/1988 | Meyers et al. | 702/75 |
| 4,819,179 | 4/1989 | Klein | 702/124 |
| 4,896,337 | 1/1990 | Bushy, Jr. | 375/371 |
| 4,953,117 | 8/1990 | Lagadec | 364/724.1 |
| 5,151,869 | 9/1992 | Alcala | 702/32 |
| 5,198,748 | 3/1993 | Tsui et al. | 702/77 |
| 5,406,495 | 4/1995 | Hill | 702/72 |
| 5,461,329 | 10/1995 | Linehan et al. | 324/772 |
| 5,544,065 | 8/1996 | Engel et al. | 702/75 |

OTHER PUBLICATIONS

"Field Experience With a Digital Relay for Synchronous Generators," 89 SM 731–1 PWRD [cited in parent case 08/574,357, filed Dec. 18, 1995].

"Performance Assessment of a New Digital Subsystem for Generator Protection," presented on Oct. 13–14, 1994 [cited in parent case 08/574,357, filed Dec. 18, 1995].

"A New Measurement Technique for Tracking Voltage Phasors," Local System Frequency and Rate of Change of Frequency, IEEE Transactions on Power Apparatus and Systems, vol. PAS 102, No. 5, May, 1983 [cited in parent case 08/574,357, filed Dec. 18, 1995].

(List continued on next page.)

*Primary Examiner*—James P. Trammell
*Assistant Examiner*—Cuong H. Nguyen
*Attorney, Agent, or Firm*—Woodcock Washburn Kurtz Mackiewicz & Norris LLP

[57] ABSTRACT

A method for estimating phasors and tracking the frequency of a signal during frequency ramping is provided. The method uses a variable N-point DFT periodically to compute one or more phasors based on data acquired from one or more sampled signals. The period between DFT computations is a predetermined number of sample periods. After each DFT computation, the change in phasor angle between the current phasor estimate and the most previous phasor estimate is determined and used to estimate the instantaneous frequency of the signal. The current instantaneous frequency estimate and the most previous instantaneous frequency estimate are averaged to compute an average cycle frequency. In addition, a number of discrete frequencies and corresponding DFT windows based on a fixed sampling rate and a predetermined fundamental frequency of the signal are defined and used in estimating the instantaneous frequency. Once the average cycle frequency is determined the DFT window is adjusted by setting it equal to the DFT window corresponding to the discrete frequency closest to the average cycle frequency. A generator protection system analyzing voltage and current signals output from a generator is also provided. The voltage and current signals are monitored by respective voltage and current sensors to produce a plurality of signals representative of voltage and current characteristics of the generator. The system comprises components for receiving and sampling signal input, and for processing the samples according to the inventive method.

18 Claims, 8 Drawing Sheets

OTHER PUBLICATIONS

"An Adaptive Sampling–Interval Generator for Digital Relaying," IEEE Transactions on Power Delivery, vol. 4, No. 3, Jul., 1989 [cited in parent case 08/574,357, filed Dec. 18, 1995].

D.H. Hart et al., Protection Algorithms for the Gpu, Task Report III, ABB Transmission Technology Institute Task Report PSC 96–R–0035, Sep. 17, 1996.

D. Hart et al., Protection Algorithms for the GPU, Task Report I., ABB Transmission Technology Institute Task Report PSC 95–R–0013, Mar. 24, 1995.

GENERATOR PROTECTION SYSTEM AND METHOD FOR PHASOR ESTIMATION AND FREQUENCY TRACKING DURING FREQUENCY RAMPING

RELATED APPLICATION

This is a continuation-in-part of copending application Ser. No. 08/574,357 filed Dec. 18, 1995 U.S. Pat. No. 5,721,689 issued on Feb. 24, 1998.

FIELD OF THE INVENTION

The present invention relates to frequency tracking in digital systems, and more particularly, to a generator protection system and a new method of phasor estimation and frequency tracking during frequency ramping.

BACKGROUND OF THE INVENTION

Digital protection systems are used, for example, in power systems to monitor the voltage and current signals provided by electrical generators. Such digital protection systems may be embodied in a generator protection unit (GPU). A GPU estimates voltage and current phasors based upon the voltage and current signals and from those phasors detects various fault conditions requiring system shut down. The phasors are also used for metering functions performed by remote users and for other power system control functions. Abnormal conditions may additionally be detected through relatively large changes in the generator's operating frequency. Accordingly, an adaptive technique for tracking the generator frequency is important for both generating accurate voltage and current phasors and for monitoring fault conditions in the generator by detecting a significant change in the generator frequency.

While the present invention will be described in the context of a GPU implementation, those of ordinary skill in the art will readily understand that the inventive techniques described herein may be implemented in a variety of systems in which signal phasors are generated and accurate adaptive frequency tracking is required.

FIG. 1 shows a GPU 20 and a generator 10. Voltage signals output from the generator ($V_{out}$) are sensed by voltage sensors 12. Potential transformers, resistive dividers, or the like, may be employed as voltage sensors. The sensed voltage signals are output from the voltage sensors 12 to the GPU 20. It should be understood that the generator produces three-phase power, and accordingly, the voltage signals output from the generator may include $V_A$, $V_B$, and $V_C$, or alternatively may include line-to-line voltages $V_{AB}$, $V_{BC}$, and $V_{CA}$.

Current sensors 14 which, for example, may be a plurality of current transformers, are used to sense current signals output from the generator ($I_{out}$) to both the GPU and to the power system. If, for example, the currents output to the GPU and to the power system are not equal then a fault condition may exist. The sensed currents, which may include each line current $i_A$, $i_B$, and $i_C$, are provided as input to the GPU 20.

The GPU 20 includes A/D converter 15, digital signal processor (DSP) 16, microprocessor 17, and external interface 18. The A/D converter 15 samples the sensed voltage and current signals and provides digital voltage and current samples to the DSP 16. The DSP 16 may generate voltage phasors by utilizing discrete fourier transforms (DFTs) to be described in more detail below, and then tracks the operating frequency of the generator 10 based on the generated phasors. Phasor data and frequency estimates are output from the DSP 16 to the microprocessor 17.

The microprocessor 17 uses this information to detect faults in the power system or generator malfunctions. If a fault or malfunction is detected the microprocessor 17 outputs a signal through the external interface 18 to a circuit breaker causing the circuit breaker to open its current carrying contacts so that the system is effectively shut down.

Users may wish to access the phasor and frequency estimates. For example, engineers may be required to monitor system performance for a variety of reasons. Accordingly, the phasor data and frequency estimates may be output from the DSP 16 and stored by the microprocessor 17 in a memory (not shown). If the data is then needed, it may be accessed by the user upon request which may be transmitted to the microprocessor 17 via the external interface 18. The external interface 18 may include an RS232 interface. The microprocessor 17 transfers the stored data from the memory to the user via the external interface 18.

While other techniques may be used to generate the phasor data, the DFT is commonly used because it is very efficient in estimating a particular frequency. Consider the waveform s(t) given by:

$$s(t)=B\cos(\omega t+\gamma) \tag{1}$$

Then, sampling at N samples per cycle, the waveform is given by:

$$S_k = S(t_k) = B\cos(\omega t_k + \gamma) = B\cos\left(\frac{2\pi}{n}k+\gamma\right) = B\cos(\psi k+\gamma). \tag{2}$$

where $\psi$ is defined as $2\pi/N$ and the samples of $s(t_k)$ are:

$$S_0 = S(t_0) = B\cos(\omega t_0 + \gamma) = \frac{B}{2}[e^{j(0*\psi)}e^{j\gamma} + e^{-j(0*\psi)}e^{-j\gamma}] \tag{3}$$

$$S_1 = S(t_1) = B\cos(\omega t_1 + \gamma) = \frac{B}{2}[e^{j(1*\psi)}e^{j\gamma} + e^{-j(1*\psi)}e^{-j\gamma}] \tag{4}$$

$$S_{N-1} = S(t_{N-1}) = B\cos(\omega t_{N-1} + \gamma) = \frac{B}{2}[e^{j((N-1)*\psi)}e^{j\gamma} + e^{-j((N-1)*\gamma)}e^{-j\gamma}] \tag{5}$$

Multiplying each sample by corresponding $e^{-j(k\psi)}$(k=0,N−1) and summing, then rearranging, results in the DFT formula given by:

$$Be^{j\gamma} = \frac{2}{N}\sum_{k=0}^{N-1} S_k e^{-j(k\psi)} \tag{6}$$

Note that the rms value requires division by a factor of the square root of 2.

The above description of the DFT assumes an integer samples per cycle N, resulting in a sampling frequency $f_s=(N\cdot f)$, where f is the fundamental frequency, for example, the expected operating frequency of the generator when fully energized. The fundamental frequency is related to the DFT window and may be an assumed value. With a sampling frequency of 60×32=1920 Hz, the DFT calculation using a 32 sample window will have a fundamental frequency of 60 Hz. At the same sampling frequency for a DFT window of N=22 samples, the DFT fundamental frequency is 87.27 Hz. Thus, the sampling frequency is an integer multiple of the fundamental frequency. The actual generator frequency varies from the DFT fundamental frequency by an amount Δf. Application of the DFT when $f_s$ is not an integer of the fundamental will introduce an "error" in the phasor estimate. This error is used to estimate the actual frequency using the deviation from fundamental frequency.

Considering the signal defined by equation (1) where ω is defined as $2\pi(f+\Delta f)$, and $f_{s=}(N\cdot f)$. Applying the DFT equation results in:

$$DFT = \frac{2}{N} \sum_{k=0}^{N-1} S_k e^{-j(k\psi)} = Be^{j\gamma} \frac{\sin\left(\frac{\pi\Delta f}{f}\right)}{N\sin\left(\frac{\pi\Delta f}{fN}\right)} e^{j(-\frac{\pi\Delta f}{f} - \frac{\pi\Delta f}{fN})} + \quad (7)$$

$$Be^{-j\gamma} \frac{\sin\left(\frac{\pi\Delta f}{f}\right)}{N\sin\left(\frac{\pi\Delta f}{fN} + \frac{2\pi}{N}\right)} e^{j(-\frac{\pi\Delta f}{f} + \frac{\pi\Delta f}{fN} + \frac{2\pi}{N})}$$

From the above equation, it is easy to determine that if the input signal is at frequency f, and Δf is zero and the equation simplifies to equation (6). It is also important to note that γ is the offset angle and will vary depending on when the DFT estimate begins. Therefore, equation (7) can be expressed as follows:

$$DFT = \frac{2}{N} \sum_{k=0}^{N-1} S_k e^{-j(k\psi)} = k_1 P + k_2 P^* e^{j(\frac{2\pi}{N})} \quad (8)$$

where $$k1 = \frac{\sin\left(\frac{\pi\Delta f}{f}\right)}{N\sin\left(\frac{\pi\Delta f}{fN}\right)}, \quad k2 = \frac{\sin\left(\frac{\pi\Delta f}{f}\right)}{N\sin\left(\frac{\pi\Delta f}{fN} + \frac{2\pi}{N}\right)}, \quad (9)$$

$$P = Be^{j\gamma} e^{j(-\frac{\pi\Delta f}{f} - \frac{\pi\Delta f}{fN})}$$

and where P is the complex phasor and P* is the complex conjugate of P. An exemplary phasor diagram is shown in FIG. 2. Note that each phasor is indicative of the instantaneous magnitude, angular frequency and phase of the signal at the time of sampling.

For frequency estimation, the input signal is assumed to be at the fundamental frequency f. The actual generator frequency is determined by computing Δf, then adjusting the frequency estimate.

A simplification of equations (7) and (8) may be used for the estimation of the frequency. If the frequency deviation is small, then sin(θ) approaches θ. Under this condition, equations (7) and (8) simplify to:

$$DFT = \frac{2}{N} \sum_{k=0}^{N-1} S_k e^{-j(k\psi)} \approx Be^{j\gamma} \frac{\frac{\pi\Delta f}{f}}{N\frac{\pi\Delta f}{fN}} e^{j\left(\frac{\pi\Delta f}{f} - \frac{\pi\Delta f}{fN}\right)} + 0 = \quad (10)$$

$$Be^{j\gamma} e^{j\left(\frac{\pi\Delta f}{f} - \frac{\pi\Delta f}{fN}\right)}$$

In the above equation, the values of N and f are known. Δf is an unknown which must be determined to calculate the actual operating frequency. FIG. 3 shows the sampled waveform of the signal represented by equation (1). The cosine waveform has an offset angle of 0 degrees when sampled at instant $t_k$. Using the previous cycle of data, the DFT is computed according to equation (10). A new sample is acquired at instant $t_{k+1}$ when the waveform has a new offset angle β. The offset angle between two consecutive samples (shown in FIG. 3) is given by:

$$\beta = e^{j\left(\frac{2\pi(f+\Delta f)}{fN}\right)} \quad (11)$$

Thus, the ratio of two consecutive DFT estimates is given by:

$$\frac{DFT(t_k+1)}{DFT(t_k)} = \frac{Be^{j\gamma} e^{j\left(\frac{\pi\Delta f}{f} - \frac{\pi\Delta f}{fN}\right)} e^{j\left(\frac{2\pi(f+\Delta f)}{fN}\right)}}{Be^{j\gamma} e^{j\left(\frac{\pi\Delta f}{f} - \frac{\pi\Delta f}{fN}\right)}} \quad (12)$$

Ignoring the magnitude and examining the argument yields:

$$\arg\frac{DFT(t_k+1)}{DFT(t_k)} = \theta = \frac{2\pi(f+\Delta f)}{fN} \quad (13)$$

By determining the DFT at different points in time, the angle difference from the two DFT estimates can be used to compute the actual operating frequency given by f+Δf. Solving equation (13) for f+Δf yields:

$$f+\Delta f=\theta\cdot f N/2\pi \quad (14)$$

One known technique for tracking the generator frequency is to track the frequency, then adjust the sampling rate in order to maintain a fixed number of samples per cycle. Thus, if the GPU acquired 12 samples per 60 Hz cycle, the sampling interval, Δt, would be 1.388 msecs. If the frequency changed to 30 Hz, the sampling interval, Δt, would be adjusted to 2.77 msecs. However, the DFT window N would remain unchanged.

While this technique provides reasonably good frequency tracking capabilities using a simple N-point DFT and thus only requires a single set of DFT coefficients, it also has numerous disadvantages and shortcomings. For example, the variable DFT window requires an adjustable sampling rate that can be costly and relatively complex to implement through a variable A/D sampling circuit. Moreover, all of the data and samples must be stored noting the variable sampling interval along with the variable DFT window used to compute the phasor data thereby complicating the system's storage and display requirements as well as adding complexity to the data analysis and manipulation.

Still further, while this technique limits the effects of transients it still tracks the transients causing unnecessary error in the frequency estimates. Specifically, if a transient occurs during a single cycle, the frequency estimate is adjusted by +/−5 Hz—a relatively large adjustment. If during the next cycle, the transient has dissipated, frequency tracking is resumed based on an estimated frequency containing a relatively large error. Moreover, if the transient persists for several cycles, then it may seriously degrade frequency tracking once the transient has substantially subsided.

Additionally, this technique does not provide adequate harmonic rejection. Thus frequency estimates associated with harmonics in the sampled signals may result in the aforementioned adjustments associated with transients. The effects of large adjustments associated with harmonics may be profound while the generator is ramping up to its normal operating frequency.

Importantly, if this technique fails to track the frequency properly the varying sampling interval, Δt, can exceed a critical interval such that required sampling data is missed. Thus time-domain back up functions may be ineffective or impossible to implement using this frequency tracking technique.

U.S. Pat. No. 5,721,689, assigned to the same assignee hereunder, discloses and claims a technique for accurate frequency tracking and phasor estimation in a GPU. According to that technique, a signal is sampled at a fixed Δt over a cycle window that includes N samples. The instantaneous frequency of the signal, f+Δf, is estimated for each sample as explained above in connection with equations 12, 13, and 14. The instantaneous frequencies estimated over the cycle window N are then averaged to generate an average cycle frequency. The average cycle frequency is then used to select the cycle window N for the next cycle. Thus the cycle N is varied instead of the sampling interval, Δt.

During frequency ramping (i.e., when the generator frequency changes rapidly as a function of time), small errors in the frequency estimates have been observed. Frequency ramping occurs when, for example, a generator is powered on or off. FIG. 4 shows the results of an experiment conducted using the inventive technique disclosed and claimed in U.S. Pat. No. 5,721,689. The generator frequency is shown to have linearly increased from 20 Hz at time zero, to 60 Hz two seconds later. Thus. the rate of increase was 20 Hz/sec. As shown in FIG. 4, the estimated frequency lagged behind the actual frequency of the generator. This lag is attributable to a time delay in updating the frequency estimate.

It should be understood that, during frequency ramping, when the signal frequency is changing rapidly, the signal cycle is also changing rapidly. Thus, the signal frequency has changed sufficiently that, by the time a new frequency estimate is determined (i.e., the instantaneous frequencies have been accumulated over one complete cycle N and then averaged), the new frequency estimate is already obsolete.

It has also been observed that computing a DFT and determining a new instantaneous frequency for every input sample places an excessive computational load on the DSP that performs this processing.

Thus, there is a need for an improved frequency tracking algorithm that reduces computational processing requirements on the DSP and more accurately tracks signal frequency during frequency ramping.

SUMMARY OF THE INVENTION

The present invention fulfills this need by providing a method of tracking the frequency of a signal including the following steps: sampling the signal at a predetermined fixed sampling rate; determining a first phase angle based on a first sequence of N successive samples; determining a second phase angle based on a second sequence of N successive samples, the last sample of the second sequence being offset from the last sample of the first sequence by a predetermined number of sample periods; determining the change in phase angle of the signal based upon the difference between the first phase angle and the second phase angle; estimating the current instantaneous frequency of the signal based upon the change in phase angle; averaging the current instantaneous frequency estimate and the most previous instantaneous frequency estimate to compute an average cycle frequency; and adjusting N based on the average cycle frequency.

In a preferred embodiment, an N-point DFT is performed once every eight samples thereby generating a phasor indicative of the instantaneous magnitude, angular frequency, and phase angle of the signal. The change in phase angle is then the argument of the current phasor to the most previously computed phasor.

According to the invention, a range of discrete frequencies $f_n$ is preferably defined such that each discrete frequency in the range is the predetermined fixed sampling rate divided by a multiple integer of samples $N_n$, wherein the multiple integer of samples is the number of samples per cycle of the corresponding discrete frequency based on the predetermined fixed sampling rate. Preferably, after a predefined number of sample periods, $N_{update}$, the instantaneous frequency corresponding to a current sample f(k) is estimated according to the following relationship:

$$f(k) = \theta(k) \cdot f \cdot N / (2\pi \cdot N_{update})$$

where θ(k) is the change in phasor angle, $f_n$ is the discrete frequency closest to the previous average cycle frequency, and $N_n$ is the number of samples per cycle corresponding to the discrete frequency. More preferably, a maximum number of successive samples $N_{max}$ is defined. For each $N_n$ that does not exceed $N_{max}$ all of the $N_n$ samples are utilized in determining the phase angle of the signal. For each $N_n$ greater than $N_{max}$, a predetermined number of samples $N_{skip}$ are skipped so that the N samples used in determining the phase angle of the signal exclude $N_{skip}$ samples between each of the N samples and $N_n$ is reduced by the factor of ($N_{skip}$+1). The instantaneous frequency can then be estimated according to the following relationship:

$$f(k) = \theta(k) \cdot f_n \cdot N_n \cdot (N_{skip}+1)/(2\pi \cdot N_{update})$$

The inventive method may be particularly advantageous when implemented in a GPU to track the frequency of a generator during a frequency ramping state. In a preferred embodiment of the invention, the operating frequency of the generator is tracked over a range of about 16 Hz to about 87 Hz. The maximum number of successive samples preferably does not exceed 38 samples.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE INVENTION

Figure 5:
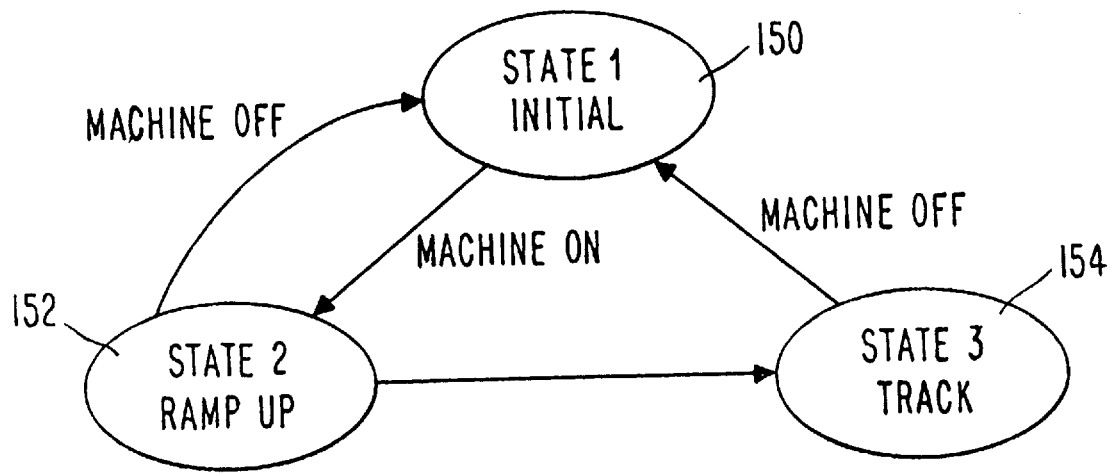
FIG. 5 shows a state diagram of the overall frequency tracking procedure implemented in a GPU in accordance with the present invention.

FIG. 5 shows a state diagram of the overall frequency tracking procedure implemented in a GPU in accordance with the present invention. During the initial state at 150, the signal samples are monitored to check for a "non-zero" condition indicating that the generator has been energized, i.e. the generator has been turned on and current has been supplied (referred to hereinafter as a "machine on condition"). Once a machine on condition has been detected, the procedure advances to the next state, generator ramp up at 152. During the generator ramp up state, frequency tracking is commenced using special procedures to be described in detail below until the generator is ramped up to its fundamental frequency, i.e. the anticipated operating frequency when fully energized. In other words, if the operating frequency of the generator should be 60 Hz when fully energized, the fundamental frequency is defined herein as 60 Hz. During the ramp up state the generator frequency is tracked and a DFT window is determined even if the frequency has not reached the fundamental frequency.

Once the ramp up frequency has been tracked for a full cycle, the procedure advances to the next state, tracking at 154. During tracking, phasors are generated and the frequency estimated thereby tracking any variations in the operating frequency.

Since any such variations should be relatively small, transient control is preferably implemented. During both the generator ramp up state 152 and the tracking state 154, the sampled signals may be monitored to detect a "machine off condition" in which the generator has been shut down or has failed. Once a machine off condition is detected the procedure returns to the initial state 150.

The frequency tracking techniques used during both the ramp up and tracking states are described above and in greater detail in copending application No. 08/574,357. It should be understood, however, that the techniques described hereinbelow for the ramp up state may be applied to frequency tracking in the tracking state as well.

Figure 6:
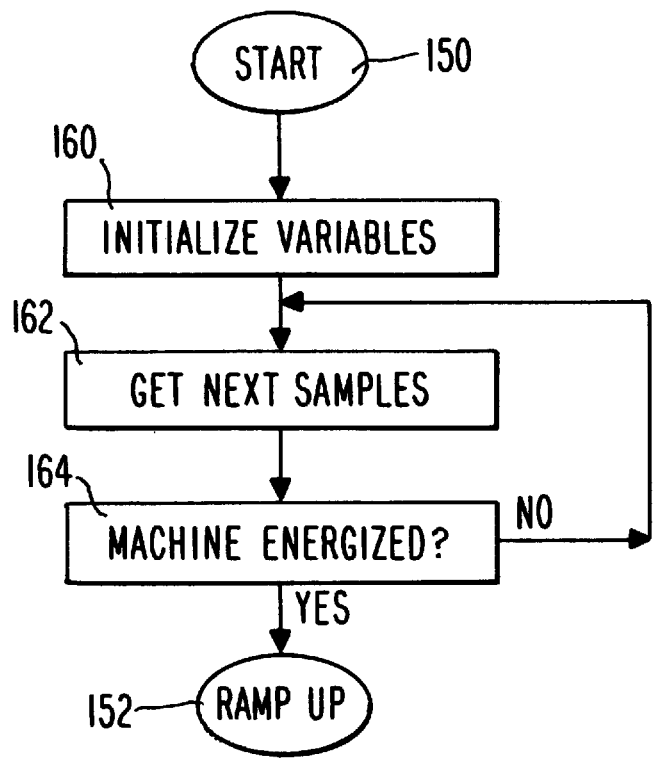
FIG. 6 shows a flow chart of the steps carried out by the tracking procedure during the initial state in accordance with a preferred embodiment of the invention.

FIG. 6 shows a flow chart of the steps carried out by the tracking procedure during the initial state in accordance with a preferred embodiment of the invention. As shown in FIG. 6, a number of program variables are initialized at step 160 as follows: the sample counter, k, is initialized to 0; the initial number of samples per cycle, $N_i$, which will be equivalent to the first DFT window, N, is set to 32; a block transient counter, B(C), is set to 0; an initial cycle flag, $C_i$, is set to 1; an initial update flag, UPDATE, is set to 1; a cycle counter C is set to 0; P(0) an initial phasor is set equal to the complex value 1+j0; and the average cycle frequency, $f_{new}$ (C), which is described in detail below is set to 60 Hz. Corresponding values of $N_n$ and $N_{skip}$ from Table 1 which is explained below, are 32 and 0, respectively. The samples output from the A/D converter are monitored at step 162 until a "non-zero" set of samples is detected at 164 indicating a "machine on condition." Once a machine on condition is encountered the tracking procedure advances to the generator ramp up state 152.

Figure 8A:
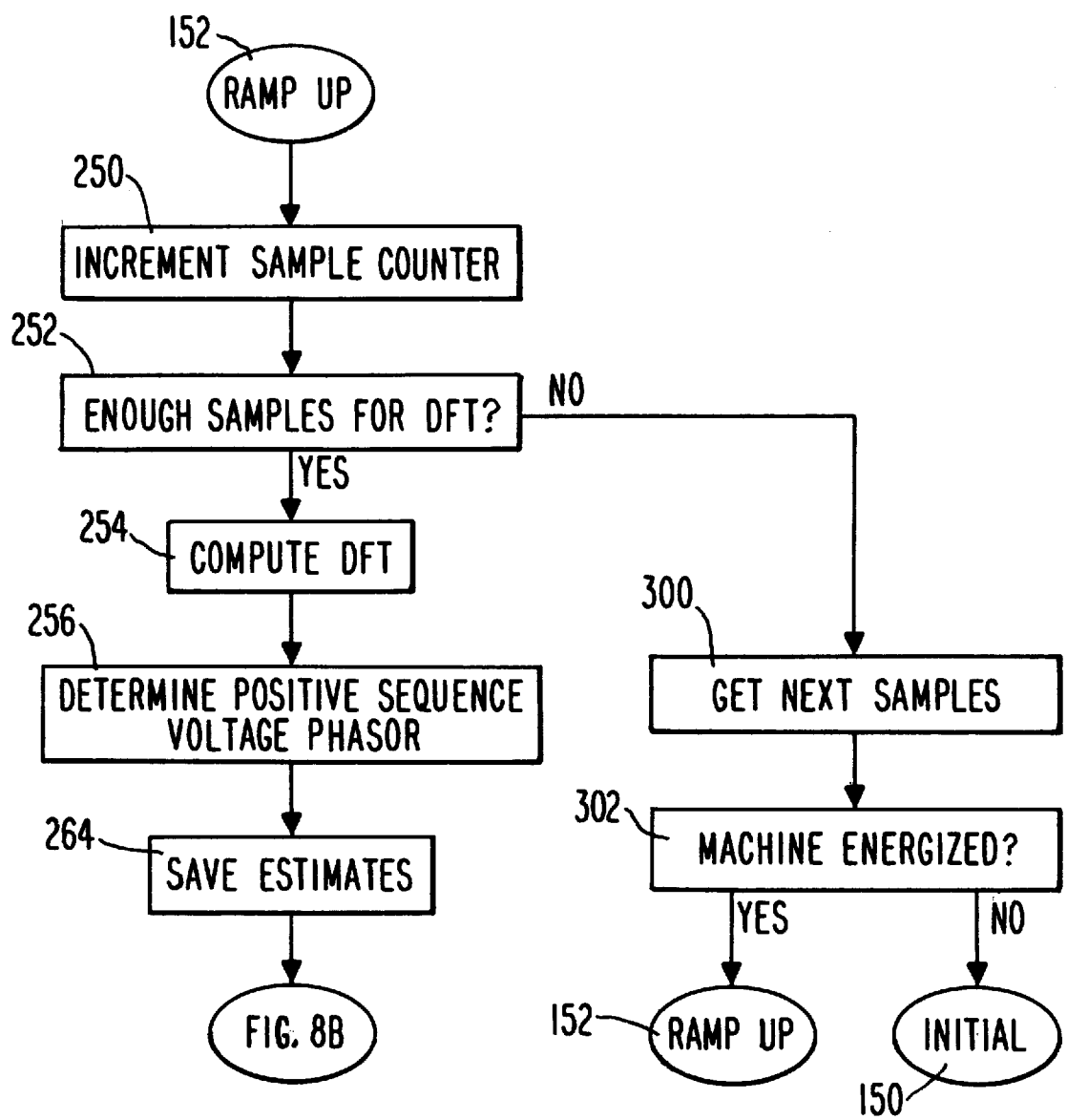
FIGS. 8A and 8B show a flow chart of the steps carried out during the generator ramp up state in accordance with a preferred embodiment of the invention.
Figure 8B:
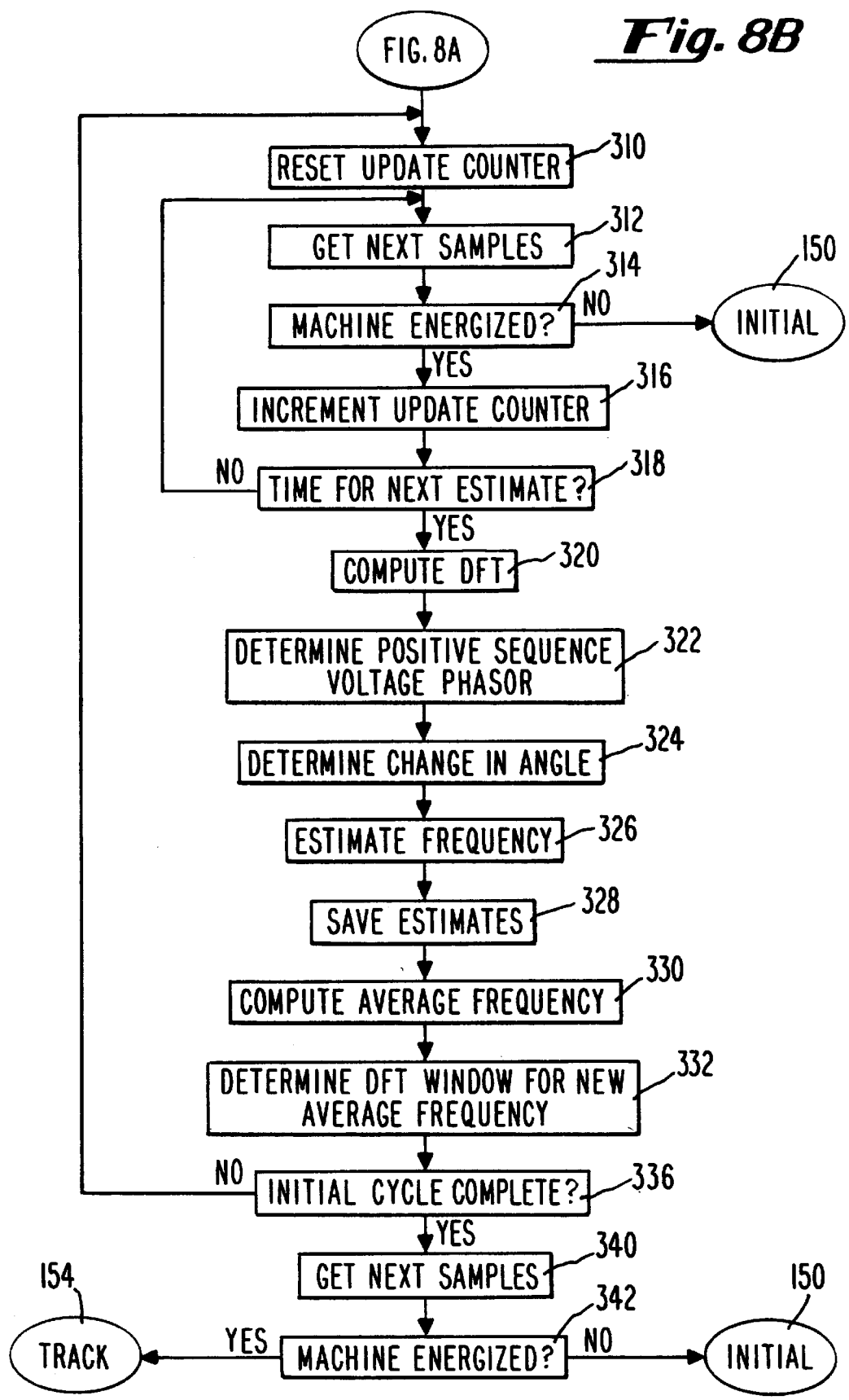

FIGS. 8A and 8B show a flow chart of the steps carried out during the ramp up state according to a preferred embodiment of the present invention. Once the generator is energized, the sample counter, k, is incremented at step 250 after each sampling interval in which a set of signals is received (e.g., one sample from each of the following sensed signals $V_A$, $V_B$, $V_C$, $i_A$, $i_B$, and $i_C$). If the received set of samples does not contain line-to-line voltage samples, then line-to-line samples are computed as follows:

$$V_{AB}(k)=V_A(k)-V_B(k) \qquad (16)$$

$$V_{BC}(k)=V_B(k)-V_C(k) \qquad (17)$$

$$V_{CA}(k)=V_C(k)-V_A(k) \qquad (18)$$

The initial DFT window is preferably obtained so that the line-to-line voltage phasors can be estimated using a DFT with a window of $N_i$. Accordingly, at step 252, $N_i$ samples are obtained before tracking begins. For example, in a preferred embodiment using $N_i$=32 samples as the initial DFT window, 32 samples would be acquired before the DFT is performed a first time.

If fewer than $N_i$ samples have been received at step 252, the next set of samples is obtained at step 300. If the samples are determined to be non-zero at step 302, then the machine is still energized and the ramp up procedure continues at step 152. If the samples indicate that the machine has been turned off, the procedure returns to the initial state at step 150.

Once $N_i$ samples have been received at step 252, a DFT is performed at step 254 to estimate the line-to-line voltage phasors. The method of the present invention tracks the frequency and uses the frequency estimates to vary the number of samples, N, in the DFT window. The DFT window according to the present invention is adjusted to be as close to 1 cycle of the signal as possible. However, since the sampling interval is fixed, the possible fundamental frequencies are discrete. Specifically, the fundamental frequency must have a period that is an integer value of the sampling interval. For a sampling interval of $\Delta t$, the possible frequencies are $1/(N\Delta t)$ where N is the number of samples per cycle.

In some applications it may be preferable to limit the number of samples actually used in the DFT. While the variable window is able to cover a large frequency range, the window length can become very large for real time computations. This problem is overcome by not utilizing every sample in the DFT window for the DFT computation, but rather only enough samples to satisfy the Nyquist criterion. In particular, a number of samples to be skipped ($N_{Skip}$) for certain discrete frequencies may be selected so that the DFT does not use more than a maximum number of samples ($N_{max}$). Accordingly, for a sampling interval of $\Delta t$, the possible frequencies are $1/(N_n \cdot (N_{skip}+1) \cdot \Delta t)$ where $N_n$ is the number samples in the DFT computation and the product $N_n(N_{skip}+1)$ is the total number of samples per cycle at the corresponding discrete frequency $f_n$. Thus, the product $N_n(N_{skip}+1)$ defines the DFT window.

For the case of $\Delta t=(1/60)/32$ (32 samples per cycle at 60 Hz), some of the possible discrete frequencies are listed in Table 1 below. According to a preferred embodiment of the present invention, a maximum number of samples $N_{max}$ of 38 is imposed for the DFT computation by skipping $N_{skip}$ samples between every sample used in the DFT as set forth in Table 1 below.

TABLE 1

| Frequency ($f_n$) | No. of DFT Samples ($N_n$) | No. of Samples to Skip ($N_{skip}$) |
|---|---|---|
| 87.2727 | 22 | 0 |
| 83.4783 | 23 | 0 |
| 80.0000 | 24 | 0 |
| 76.8000 | 25 | 0 |
| 73.8462 | 26 | 0 |
| 71.1111 | 27 | 0 |
| 68.5714 | 28 | 0 |
| 66.2069 | 29 | 0 |
| 64.0000 | 30 | 0 |
| 61.9355 | 31 | 0 |
| 60.0000 | 32 | 0 |
| 58.1818 | 33 | 0 |
| 56.4706 | 34 | 0 |
| 54.8571 | 35 | 0 |

TABLE 1-continued

| Frequency (f$_n$) | No. of DFT Samples (N$_n$) | No. of Samples to Skip (N$_{skip}$) |
|---|---|---|
| 53.3333 | 36 | 0 |
| 51.8919 | 37 | 0 |
| 50.5263 | 38 | 0 |
| 48.0000 | 20 | 1 |
| 45.7143 | 21 | 1 |
| 43.6364 | 22 | 1 |
| 41.7391 | 23 | 1 |
| 40.0000 | 24 | 1 |
| 38.4000 | 25 | 1 |
| 36.9231 | 26 | 1 |
| 35.5556 | 27 | 1 |
| 34.2857 | 28 | 1 |
| 33.1034 | 29 | 1 |
| 32.0000 | 30 | 1 |
| 30.9677 | 31 | 1 |
| 30.0000 | 32 | 1 |
| 29.0909 | 33 | 1 |
| 28.2353 | 34 | 1 |
| 27.4286 | 35 | 1 |
| 26.6667 | 36 | 1 |
| 25.9459 | 37 | 1 |
| 25.2632 | 38 | 1 |
| 24.6154 | 26 | 2 |
| 23.7037 | 27 | 2 |
| 22.8571 | 28 | 2 |
| 22.0690 | 29 | 2 |
| 21.3333 | 30 | 2 |
| 20.6452 | 31 | 2 |
| 20.0000 | 32 | 2 |
| 19.3939 | 33 | 2 |
| 18.8235 | 34 | 2 |
| 18.2857 | 35 | 2 |
| 17.7778 | 36 | 2 |
| 17.2973 | 37 | 2 |
| 16.842 | 38 | 2 |

Thus, for the frequency range of interest (about 16–88 Hz) in a preferred embodiment of the invention, a one-cycle DFT window would include 22 to 96 samples. Then for each of the line-to-line voltages, an N-point DFT is performed at 254 resulting in 3 phasors representative of each instantaneous line-to-line voltage corresponding to the current interval k. The DFT is computed at step 254 from equation (6) above.

Figure 7:
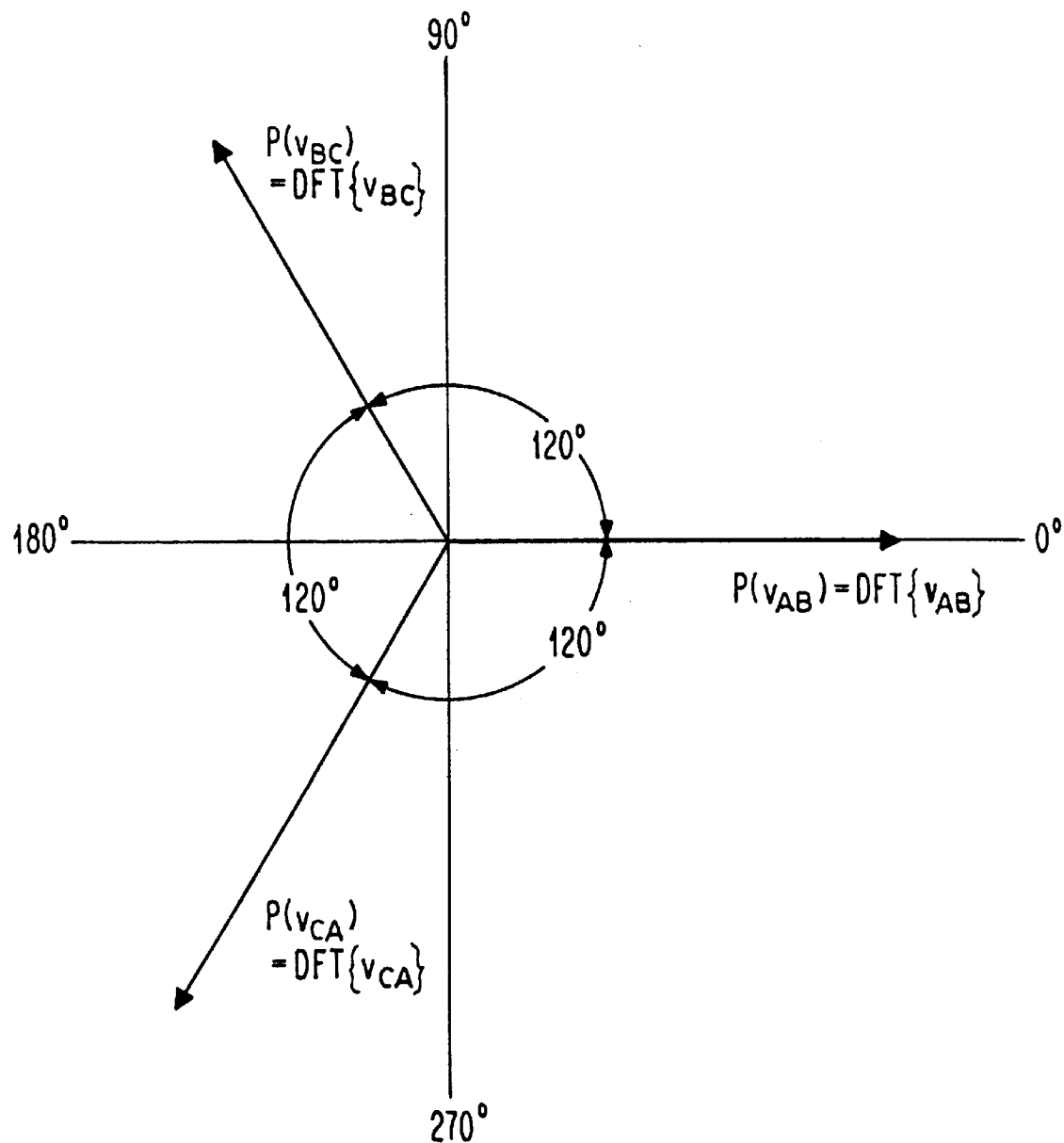
FIG. 7 shows a phasor diagram for a balanced system.

Next, the positive sequence voltage is computed at step 256 from the DFT outputs for the current sample, k. Power systems are known to have positive sequence components, negative sequence components and zero sequence components. FIG. 7 shows a phasor diagram for a balanced system. If all 3 phases of the power system are balanced then only positive sequence components are present. In a balanced system, the three line-to-line voltage phasors are equispaced in the phasor diagram such that the three phasors are separated by 120° as shown in FIG. 7. A positive sequence voltage phasor can be generated by shifting two of the phasors to overlie the remaining phasor. For example, if P(V$_{BC}$) is shifted −120° and P(V$_{CA}$) is shifted −240°, then all three phasors have the same phasor angle P(V$_{AB}$) of 0°. Thus a single phasor representing the positive sequence components is generated at step 256 for a balanced three-phase system according to the following equation:

$$P'(k)=\frac{1}{3} \cdot (DFT\{V_{AB}(k)\} + a \cdot DFT\{V_{BC}(k)\} + a^2 DFT\{V_{CA}(k)\}) \quad (19)$$

where P'(k) is the positive sequence voltage phasor associated with the current sampling interval, k, and a is a constant phasor corresponding to the desired phase shift. For example, a is the complex value (−.5+jSQRT(3)/2).

The current positive sequence voltage phasor estimate is then stored at step 264 for use in determining the instantaneous frequency and average cycle frequency during the next computation.

To reduce the computational load on the DSP, the method of the present invention provides for reducing the number of DFT computations performed therein. Rather than computing a new DFT and instantaneous frequency once every sample period as disclosed and claimed in copending U.S. Pat. No. 5,721,689 the method of the present invention provides for computing a new DFT and instantaneous frequency once every N$_{update}$ sample periods. In a preferred embodiment of the present invention, N$_{update}$ is eight. Thus, after the initial DFT is computed, and the initial positive sequence voltage phasor is estimated, a new DFT and instantaneous frequency are computed only once every eight sample periods. By computing a new DFT once every eight sample periods rather than once every sample period, the method of the present invention significantly reduces the computational load on the DSP. It should be understood, however, that the number of sample periods between DFT computations may be adjusted to suit the particular application of interest. Also, the number of sample periods between DFT computations need not be constant.

At step 310, in FIG. 8B, the update counter, k$_{update}$, is set to zero. The next set of samples is obtained at step 312. If the samples indicate at step 314 that the machine has been turned off, the procedure returns to the initial state at step 150. If the samples are determined to be non-zero at step 314, then the machine is still energized and the update counter, k$_{update}$, is incremented at step 316.

At step 318, the update counter, k$_{update}$ is compared against the number of sample periods between updates, N$_{update}$. If k$_{update}$ is less than N$_{update}$, then the next set of samples is obtained at step 312. If, at step 318, k$_{update}$ is equal to N$_{update}$, then a new DFT is computed at step 320 and a new positive sequence voltage phasor is computed at step 322 according to the same method as described above in connection with steps 254 and 256 above.

The change in phasor angle between P'(k) and P'(k−N$_{update}$) is then determined at step 324. From equation (13) above, it can be seen that the change in phasor angle, θ(k), is:

$$ARG\{P'(k)/P'(k-N_{update})\} \quad (20)$$

which is simply the phase angle of the phasor generated during the current sampling interval, k, minus the phase angle of the phasor generated during the last sampling interval in which a DFT was computed, k−N$_{update}$.

An instantaneous frequency is then determined at step 326 based on equation (14). Solving for f+Δf yields:

$$f(k)=\theta(k) \cdot f \cdot N /(2\pi N_{update}) \quad (21)$$

where f(k) represents the instantaneous operating frequency during the kth sampling interval, f is the most recently computed average cycle frequency, N is the number of sample intervals in the DFT window, and N$_{update}$ is the number of sample intervals between frequency estimates. Since the number of samples per cycle N can vary from each sampling interval to the next, it is difficult to ascertain an integer number of samples per cycle corresponding to the average cycle frequency. Accordingly, f and N are preferably obtained from a table of discrete frequencies f$_n$ corresponding DFT windows N$_n$ ·(N$_{skip}$+1) such as Table 1 above. Rewriting equation (21) results in:

$$f(k)=\theta(k)\cdot f_n\cdot N_n\cdot(N_{skip}+1)/(2\pi N_{update}) \quad (22)$$

Notice that when $N_{update}=1$, (i.e., a new DFT and instantaneous frequency are computed once every sample period) equations (20) through (22) reduce to the corresponding equations disclosed in U.S. Pat. No. 5,721,689.

Utilizing the positive sequence voltage phasor in the tracking procedure renders the tracking more reliable in the event that one or even two of the line-to-line voltages are not detected during a particular cycle. So long as one of the line-to-line voltage phasors can be generated, the phase angle can be determined and, in turn, an instantaneous frequency can be estimated.

The current positive sequence voltage phasor and instantaneous frequency estimates are then stored at step 328 for use in determining the instantaneous frequency and average cycle frequency during future computations.

The average cycle frequency is computed at 330 by averaging the two most recently computed frequency estimates. That is, $$f_{new}(C)=(f(k)+f(k-N_{update}))/2.$$

It is preferable to disregard the first frequency estimate after the size of the DFT window, N, changes. Thus, for subsequent computations of the average frequency at step 330, if the average frequency computation is the first average frequency computation after the size of the DFT window, N, has been changed, the newly computed average frequency is disregarded. That is, the estimated frequency remains unchanged for the first block of $N_{update}$ samples after the window size is changed, and $f_{new}(C)$ is set equal to $f_{new}(C-1)$.

Once an average cycle frequency is determined at step 330, the DFT window is updated at step 332 by identifying discrete frequency, $f_n$, which is closest to the average cycle frequency, $f_{new}(C)$ computed at step 330 and defining the new DFT window as the product of $N_n\cdot(N_{skip}+1)$ corresponding to the identified discrete frequency.

After the average cycle frequency is estimated, it is preferably compared with the fundamental frequency, 60 Hz in the example, at step 336. Specifically, if $N_n\cdot(N_{skip}+1)$ is less than N, the operating frequency has not yet ramped up to the fundamental frequency and more samples are required for a complete cycle at the fundamental frequency. However, if the average cycle frequency is at least the fundamental frequency, then a sufficient number of samples have been acquired for a complete cycle of the fundamental frequency.

If, at step 336, the average cycle frequency is less than the fundamental frequency, then a complete cycle has not yet lapsed. In that case, the update counter, $k_{update}$, is reset to zero at step 310 and a new set of samples is obtained at step 312. The process continues as above, performing a DFT, computing an instantaneous frequency, computing an average cycle frequency, and, if necessary, readjusting the DFT window after every $N_{update}$ samples, until a complete cycle of the fundamental frequency has been received as determined at step 336. Since the operating frequency of the generator is expected to be increasing during the ramp up state, the new DFT window should be lower than the DFT window determined at the initial update. However, if that is not the case, in a preferred embodiment the new DFT window is set to the initial DFT window and saved for use during the first cycle of the tracking procedure.

Figure 4:
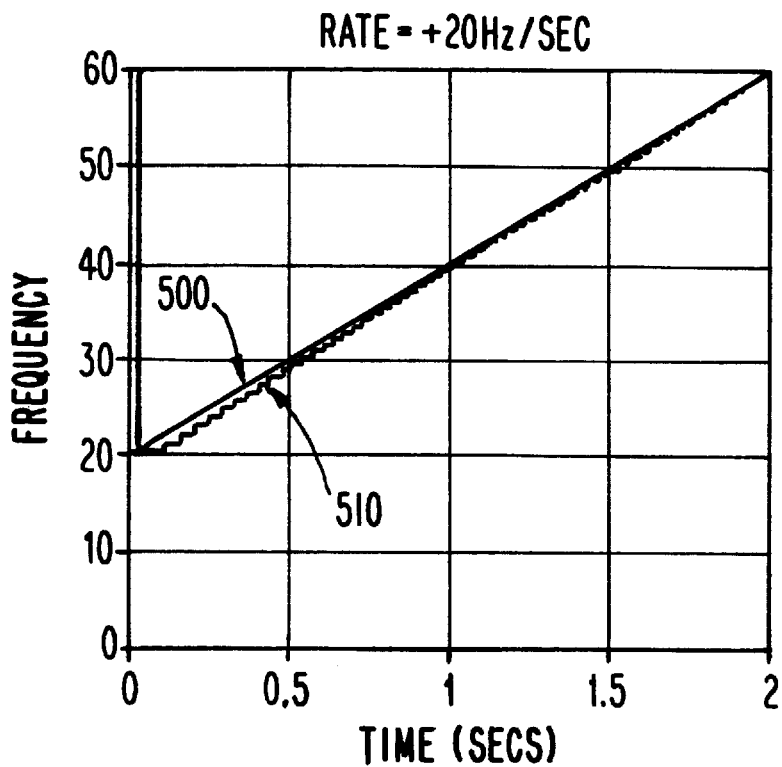
FIG. 4 shows the results of an experiment conducted using the inventive technique disclosed and claimed in copending application 08/574,357.

If, at step 336, the first cycle is complete, then the next set of samples is obtained at step 340 and the generator is checked to ensure that it is still energized at step 342. Then, the tracking procedure disclosed and claimed in U.S. Pat. No. 5,721,689 and hereinabove commences at step 154. If the generator is no longer energized as determined at step 342 the procedure returns to the initial state 150. The generator frequency is shown to have linearly increased from 20 Hz at time zero, to 60 Hz two seconds later. Thus, the rate of increase was 20 Hz/sec. As shown in FIG. 4, the estimated frequency lagged behind the actual frequency of the generator. This lag is attributable to a time delay in updating the frequency estimate.

Figure 9:
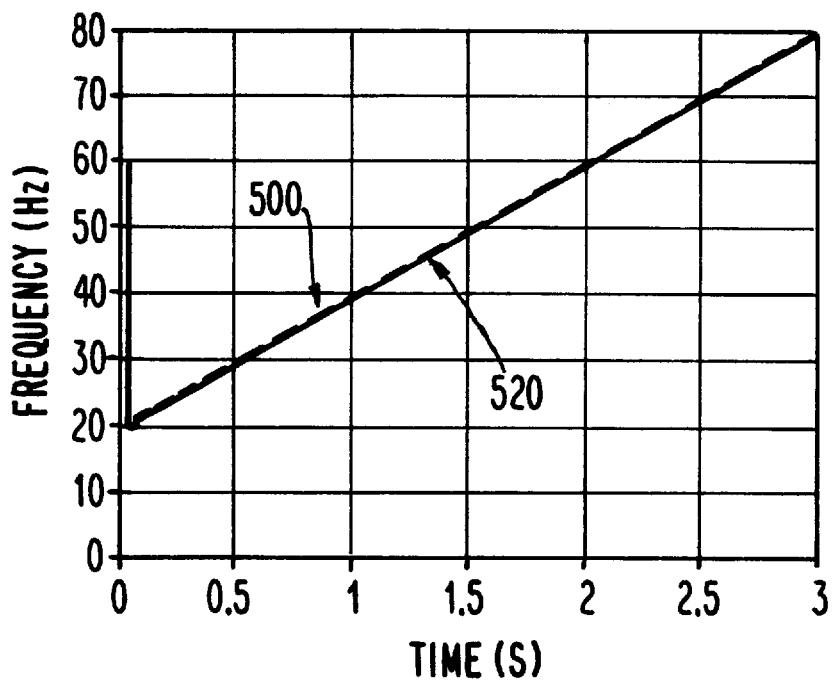
FIG. 9 shows the results of an experiment conducted using the method of the present invention.

FIG. 9 shows the results of an experiment conducted using the method of the resent invention. The generator frequency is shown to have linearly increased from 20 Hz at time zero, to 80 Hz three seconds later. Thus, the rate of increase was 20 Hz/sec. In the ramping test, frequency estimates were generated using a method according to the principles of the present invention in which an average cycle frequency was computed periodically after a predetermined number of samples (e.g., every eight samples). The results of the ramping test are shown in FIG. 9 as 520. The error in the frequency estimates using this improved approach is the difference between the values shown in plot 500 (dashed lines) and those shown in plot 520 (solid line). A comparison between the plots shown in FIGS. 4 and 9 shows that the frequency estimation error is reduced considerably when the average cycle frequency is computed (and the estimated frequency is adjusted) once every eight samples rather than once at the end of each cycle. Thus, it has been demonstrated that the method of the present invention more accurately tracks generator frequency during the ramp up phase, while at the same time reducing the computational load on the DSP.

Figure 1:
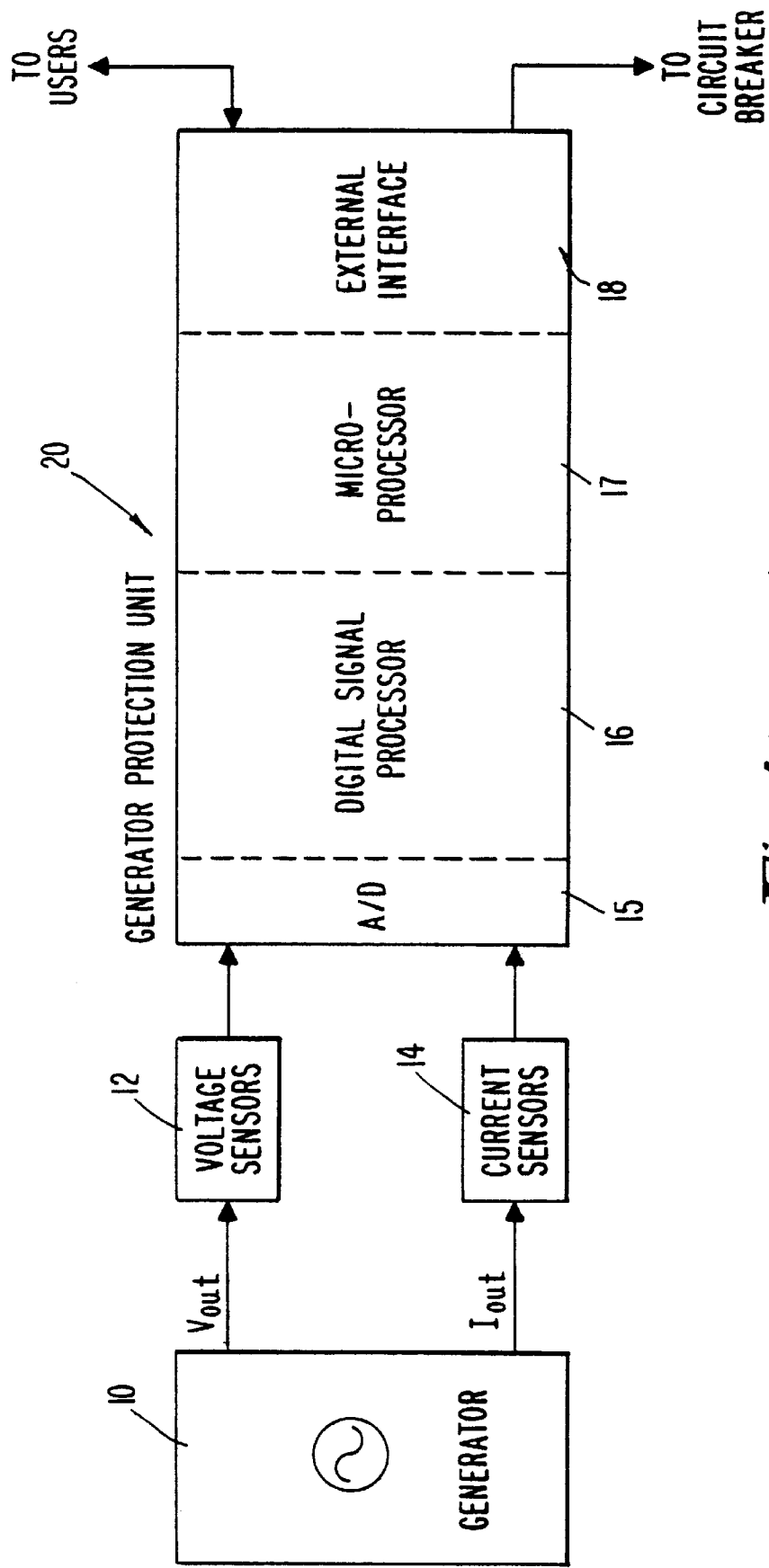
FIG. 1 shows a block diagram of a generator protection system.
Figure 2:
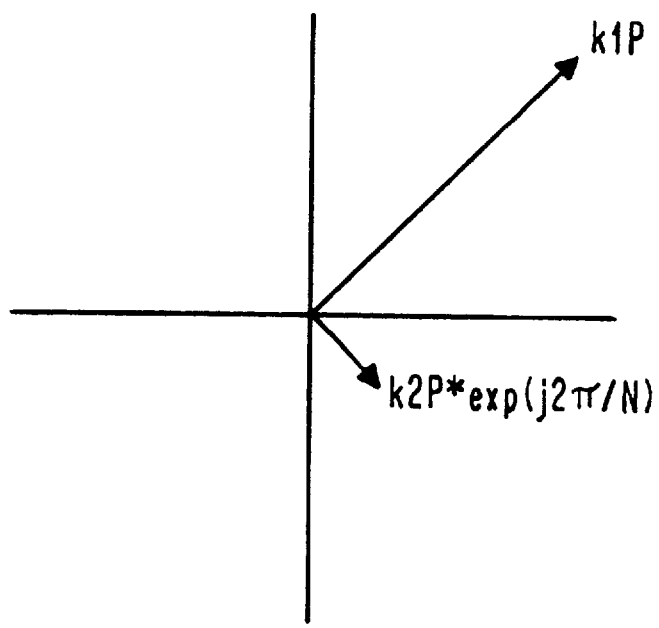
FIG. 2 shows an exemplary phasor diagram.
Figure 3:
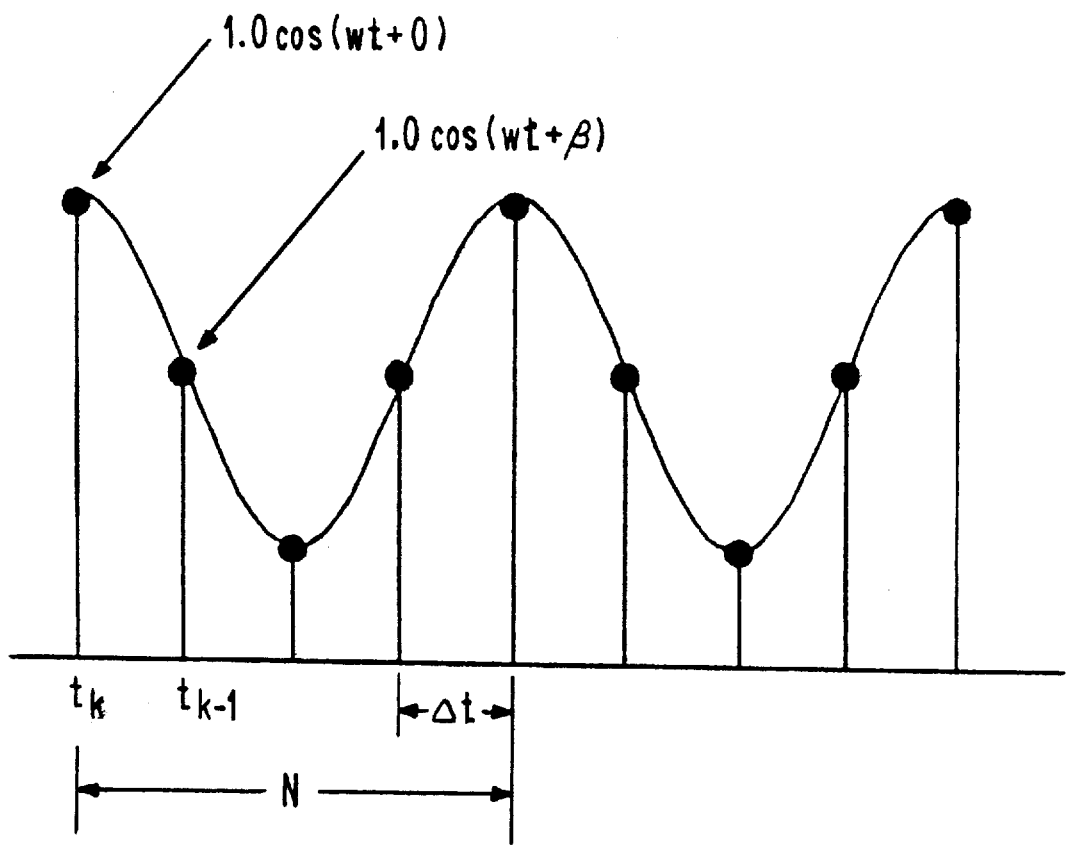
FIG. 3 shows the sampled waveform of a signal having a cosine waveform.
Figure 10:
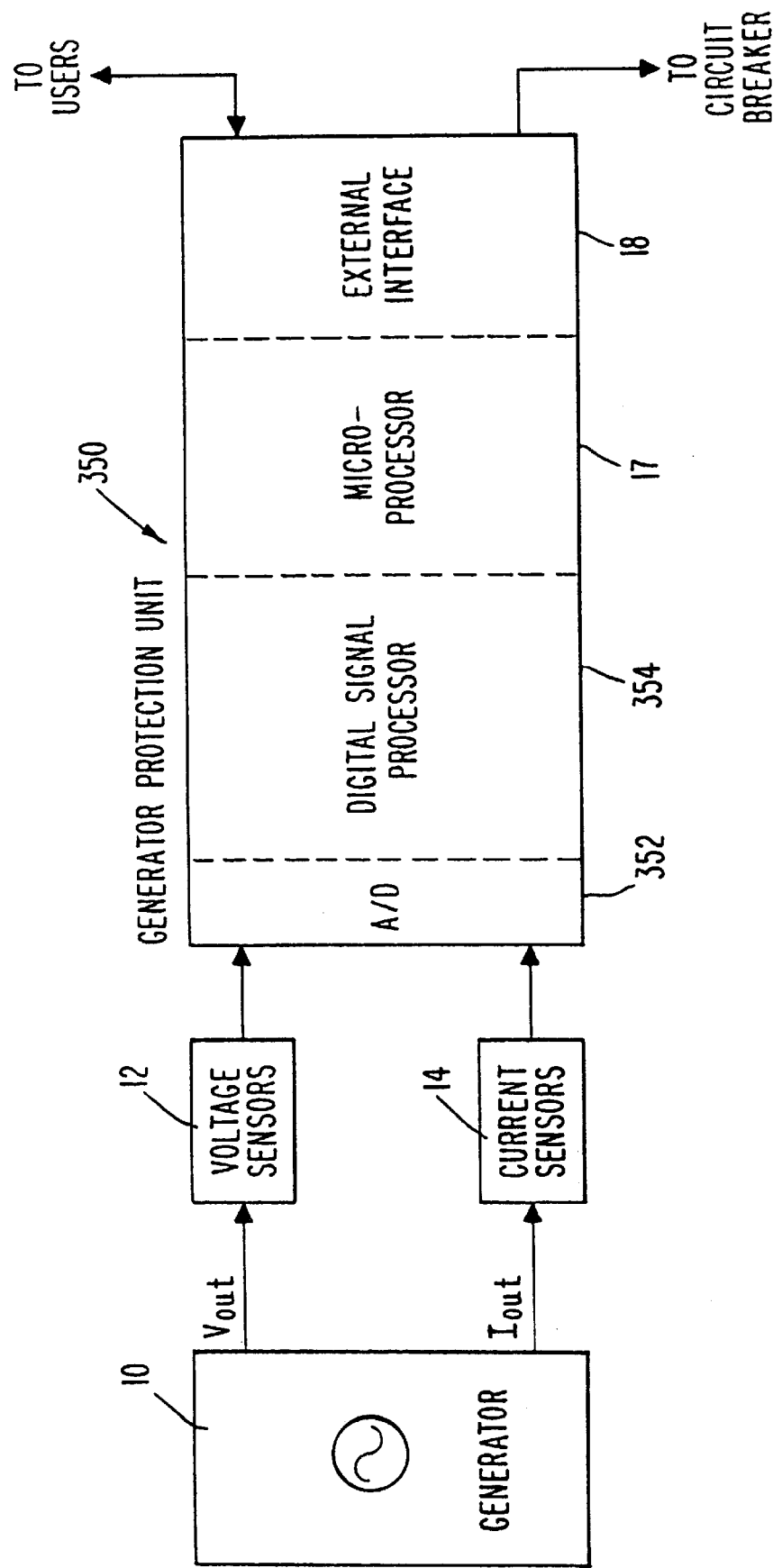
FIG. 10 shows a block diagram of a generator protection system according to the present invention.

FIG. 10 shows a block diagram of a generator protection system in accordance with the present invention. The GPU 350 is programmed in accordance with the phasor estimation and frequency tracking procedures as described hereinabove. The generator 10, current sensor 14, voltage sensor 12, microprocessor 17 and external interface 18 function in a substantially identical manner as described in connection with FIG. 1. The A/D converter 352 is programmed to sample at a fixed sampling interval unlike the A/D converter 15 shown in FIG. 1 which samples at a variable rate. The DSP 354 is specifically programmed in accordance with the present invention to track the operating frequency of the generator and determine magnitudes of voltage and current by generating phasors based on instantaneous frequency estimates.

While the invention has been described and illustrated with reference to specific embodiments, those skilled in the art will recognize that modification and variations may be made without departing from the principles of the invention as described hereinabove and set forth in the following claims.

We claim:

1. A method of tracking the frequency of a signal having an estimated frequency, comprising the steps of:

sampling the signal at a predetermined fixed sampling rate to generate a sequence of N successive samples, the last sample of the sequence being a current sample;

determining, based on the N successive samples, a phase angle of the signal corresponding to the current sample;

determining a change in phase angle of the signal based upon the difference between the phase angle corresponding to the current sample and the phase angle corresponding to a previous sample, the previous sample preceeding the current sample by a predetermined number of sample periods;

estimating the instantaneous frequency of the signal corresponding to the current sample based upon the change in phase angle;

averaging the instantaneous frequency estimate corresponding to the current sample and the instantaneous frequency estimate corresponding to a previous sample to compute an average cycle frequency; and adjusting N based on the average cycle frequency.

2. The method of claim 1, wherein the step of determining the phase angle of the signal comprises the step of:

performing an N-point DFT on the N successive samples thereby generating a phasor indicative of the instantaneous magnitude, angular frequency, and phase angle of the signal corresponding to the current sample.

3. The method of claim 2, wherein the change in phase angle is the argument of the phasor corresponding to the current sample to the phasor corresponding to the previous sample.

4. The method of claim 1, further comprising the step of:

defining a range of discrete frequencies $f_n$ such that each discrete frequency in the range is the predetermined fixed sampling rate divided by a multiple integer of samples $N_n$, wherein the multiple integer of samples is the number of samples per cycle of the corresponding discrete frequency based on the predetermined fixed sampling rate.

5. The method of claim 4, wherein the instantaneous frequency corresponding to the current sample, f(k), is estimated according to the following relationship:

$$f(k)=\theta*(f_n*N_n/2\pi)$$

where $\theta$ is the change in phasor angle, $f_n$ is the discrete frequency closest to the average cycle frequency and $N_n$ is the number of samples per cycle corresponding to the discrete frequency.

6. The method of claim 5, wherein a maximum number of successive samples $N_{max}$ is defined, for each $N_n$ that does not exceed $N_{max}$ all of the $N_n$ samples are utilized in determining the phase angle of the signal, for each $N_n$ greater than $N_{max}$, a predetermined number of samples $N_{skip}$ are skipped so that the N samples used in determining the phase angle of the signal exclude $N_{skip}$ samples between each of the N samples and $N_n$ is reduced by the factor of ($N_{skip}+1$), and wherein the instantaneous frequency is estimated according to the following relationship:

$$f(k)=\theta*(f_n*N_n*(N_{skip}+1)/2\pi).$$

7. The method of claim 2, wherein the step of adjusting N comprises the steps of:

generating a predetermined pairing of discrete frequencies $f_n$ and corresponding number of samples $N_n$ such that $f_n*N_n$ is equal to the fixed predetermined sampling rate;

identifying the discrete frequency closest to the average cycle frequency;

selecting the number of samples $N_n$ corresponding to the discrete frequency so identified; and defining the number of samples N to be the number of samples $N_n$.

8. The method of claim 1, wherein the predetermined number of sample periods is eight.

9. A method of tracking the operating frequency of an electrical generator in a generator protection unit (GPU), wherein the generator outputs a plurality of voltage signals to the GPU, the method comprising the steps:

sampling the voltage signals at a predetermined fixed rate to produce a set of voltage samples at N successive sampling intervals where N is the number of samples per cycle of the voltage signals;

generating a phasor representative of the positive sequence voltage of the plurality of voltage signals corresponding to a current sampling interval;

determining a change of the phasor angle based upon the difference between the angle of the phasor corresponding to the current sampling interval and the angle of a phasor corresponding to a previous sampling interval, the previous sampling interval preceeding the current sampling interval by a predetermined number of sampling intervals;

estimating the instantaneous frequency of the generator based on the change of the angle;

averaging the instantaneous frequency estimate corresponding to the current sampling interval and the instantaneous frequency estimate corresponding to the previous sampling interval to determine an average cycle frequency; and adjusting N based on the average cycle frequency.

10. The method of claim 9, wherein the step of generating the phasor is carried out using at least one N-point DFT, the method further comprising the steps of:

generating a predetermined pairing of discrete frequencies $f_n$ and corresponding number of samples $N_n$ such that $f_n*N_n$ is equal to the fixed predetermined sampling rate;

identifying the discrete frequency closest to the average cycle frequency; and selecting the number of samples $N_n$ corresponding to the identified discrete frequency and defining the number of samples N to be the number of samples $N_n$ for the next cycle.

11. The method of claim 9, wherein the predetermined number of sampling intervals is eight.

12. The method of claim 9, further comprising the steps of:

determining the difference between the average cycle frequency associated with a current cycle and the average cycle frequency associated with a most previous cycle and defining the difference as a frequency shift;

incrementing a transient block counter if the frequency shift is greater than a predetermined threshold; and adjusting the average cycle frequency by a predetermined frequency adjustment when the transient block counter exceeds a predetermined value.

13. The method of claim 12, wherein the predetermined threshold and the predetermined frequency adjustment are each about 5 Hz.

14. The method of claim 12, wherein the transient block counter is reset to zero each time the frequency shift does not exceed the predetermined threshold and wherein the predetermined value is ten.

15. The method of claim 9, wherein the operating frequency of the generator is tracked when the operating frequency is between about 16 Hz and 87 Hz.

16. The method of claim 15, wherein the maximum number of successive samples does not exceed 38 samples.

17. A generator protection system for analyzing voltage and current signals output from a generator wherein the voltage and current signals are monitored by respective voltage and current sensors to produce a plurality of signals representative of voltage and current characteristics of the generator, the generator protection system comprising:

sampling means for receiving an input of the plurality of signals and sampling the plurality of signals at a predetermined fixed rate to provide an output of sampled signals; and a processing means coupled to the sampling means and receiving an input of the sampled data, the processing means a) determining a change in phase angle of the signal based upon the difference between the phase angle corresponding to a current sample and the phase angle corresponding to a previous sample, the previous sample preceeding the current sample by a predetermined number of sample periods, b) estimating the operating frequency of the generator by carrying out at least one N-point DFT, where N corresponds to the DFT window to provide an instantaneous frequency estimate corresponding to the current sample, c) averaging the instantaneous frequency estimate corresponding to the current sample and the instantaneous frequency estimate corresponding to the previous sample and defining the same as an average cycle frequency, and d) varying N based on the average cycle frequency estimate.

18. The system of claim 17, wherein the predetermined number of sample periods is eight.

* * * * *